(12) United States Patent
He et al.

(10) Patent No.: US 12,100,654 B2
(45) Date of Patent: Sep. 24, 2024

(54) STORAGE DEVICE, SEMICONDUCTOR STRUCTURE AND METHOD FOR FORMING SAME

(71) Applicant: CHANGXIN MEMORY TECHNOLOGIES, INC., Hefei (CN)

(72) Inventors: Juanjuan He, Hefei (CN); Hsin-Pin Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 422 days.

(21) Appl. No.: 17/516,834

(22) Filed: Nov. 2, 2021

(65) Prior Publication Data

US 2022/0216138 A1 Jul. 7, 2022

Related U.S. Application Data

(63) Continuation of application No. PCT/CN2021/110987, filed on Aug. 5, 2021.

(30) Foreign Application Priority Data

Jan. 4, 2021 (CN) .......................... 202110003956.7

(51) Int. Cl.
*H01L 23/528* (2006.01)
*H01L 21/288* (2006.01)
(Continued)

(52) U.S. Cl.
CPC ........ *H01L 23/528* (2013.01); *H01L 21/2885* (2013.01); *H01L 21/76802* (2013.01);
(Continued)

(58) Field of Classification Search
CPC ............... H01L 23/528; H01L 21/2885; H01L 21/76802; H01L 21/7684; H01L 21/76877;
(Continued)

(56) References Cited

U.S. PATENT DOCUMENTS 9,431,355 B2   8/2016  Ning
2003/0157794 A1*  8/2003  Agarwala ......... H01L 21/76807
                                              257/E21.579

(Continued)

FOREIGN PATENT DOCUMENTS

CN        102376683 B      9/2014
CN        104701271 A      6/2015
(Continued)

*Primary Examiner* — Jonathan Han
(74) *Attorney, Agent, or Firm* — Kilpatrick Townsend & Stockton LLP

(57) ABSTRACT

A method for forming a semiconductor structure includes: providing a substrate, the substrate including an array area and a metal interconnection area located at the periphery of the array area; and forming a metal interconnection structure in the metal interconnection area, in which the metal interconnection structure includes a plurality of stacked metal wiring layers and a plurality of connecting pillars connected between each of the metal wiring layers, each of the metal wiring layer includes a plurality of metal strips distributed at intervals, the metal strips of two adjacent metal wiring layers are staggered, and two adjacent metal strips located in a same layer are respectively connected with one same metal strip directly below them through the connecting pillars.

15 Claims, 17 Drawing Sheets

(51) Int. Cl.
*H01L 21/768* (2006.01)
*H01L 23/522* (2006.01)

(52) U.S. Cl.
CPC .... *H01L 21/7684* (2013.01); *H01L 21/76877* (2013.01); *H01L 21/76892* (2013.01); *H01L 23/5226* (2013.01)

(58) Field of Classification Search
CPC ........... H01L 21/76892; H01L 23/5226; H01L 21/78; H01L 23/562; H01L 21/76808; H01L 21/76885; H01L 23/585
See application file for complete search history.

(56) References Cited

U.S. PATENT DOCUMENTS

| | | |
|---|---|---|
| 2008/0099884 A1 | 5/2008 | Inohara |
| 2015/0162285 A1 | 6/2015 | Ning |
| 2016/0211227 A1 | 7/2016 | Wagner et al. |
| 2020/0075435 A1* | 3/2020 | Chen ................. H01L 22/34 |

FOREIGN PATENT DOCUMENTS

| | | | |
|---|---|---|---|
| CN | 206758421 U | * | 12/2017 |
| CN | 109962039 A | | 7/2019 |

* cited by examiner

US 12,100,654 B2

STORAGE DEVICE, SEMICONDUCTOR STRUCTURE AND METHOD FOR FORMING SAME

CROSS-REFERENCE TO RELATED APPLICATIONS

The application is a continuation application of PCT Application No. PCT/CN2021/110987, filed on Aug. 5, 2021, which claims priority to Chinese Patent Application No. 202110003956.7, filed on Jan. 4, 2021. The disclosures of PCT Application No. PCT/CN2021/110987 and Chinese Patent Application No. 202110003956.7 are hereby incorporated by reference in their entireties.

BACKGROUND

The dynamic random access memory (DRAM) is widely used in mobile devices such as mobile phones and tablet computers because of its small size, high integration degree, fast transmission speed and the like. As the core component of the DRAM, the storage chip is mainly configured to store data.

In the procedure of manufacturing a storage chip, a plurality of storage chips are usually integrated on the same substrate, and then they are diced to obtain a plurality of single chips. However, with the continuous decrease of the interval between two adjacent storage chips, it is easy to cause damages to the structure of the chips during a dicing process, thereby reducing the device yield.

It is to be noted that the information disclosed in the above background part is merely used for enhancing the understanding of the background of the disclosure, so that information, which does not constitute the related art known by those of ordinary skill in the art, may be included.

SUMMARY

The disclosure relates to the technical field of semiconductors, and in particular relates to a storage device, a semiconductor structure and a method for forming the same.

The disclosure aims to provide a storage device, a semiconductor structure and a method for forming the same.

According to an aspect of the disclosure, a method for forming a semiconductor structure is provided, which may include the following operations.

A substrate is provided, in which the substrate includes an array area and a metal interconnection area located at the periphery of the array area.

A metal interconnection structure is formed in the metal interconnection area, in which the metal interconnection structure includes a plurality of stacked metal wiring layers and a plurality of connecting pillars connected between the metal wiring layers. Each metal wiring layer include a plurality of metal strips distributed at intervals, and the metal strips of two adjacent metal wiring layers are staggered, and two adjacent metal strips located in a same layer are respectively connected with one same metal strip directly below them through the connecting pillars.

According to an aspect of the disclosure, a semiconductor structure is provided, which includes a substrate and a metal interconnection structure.

The substrate includes an array area and a metal interconnection area located at periphery of the array area.

The metal interconnection structure is formed in the metal interconnection area, in which the metal interconnection structure may include a plurality of stacked metal wiring layers and a plurality of connecting pillars connected between the metal wiring layers; each metal wiring layer may include a plurality of metal strips distributed at intervals, and the metal strips of two adjacent metal wiring layers are staggered distributed; and two adjacent metal strips located in a same layer are respectively connected with one same metal strip directly below them through the connecting pillars.

According to an aspect of the disclosure, a storage device is provided, which includes the semiconductor structure according to any one of the above embodiments and a storage chip formed in an array area, in which the metal interconnection structure is coated around a periphery of the storage chip.

It is to be understood that the above general descriptions and detail descriptions below are merely exemplary and explanatory, which should not limit the disclosure.

BRIEF DESCRIPTION OF THE DRAWINGS

The drawings herein, which are incorporated in the specification and constitute a part of the specification, illustrate embodiments consistent with the disclosure and, together with the description, serve to explain the principles of the disclosure. It is apparent that the drawings described below are only some embodiments of the disclosure. Other drawings may further be obtained by those of ordinary skilled in the art according to these drawings without creative work.

DETAILED DESCRIPTION

Figure 1:
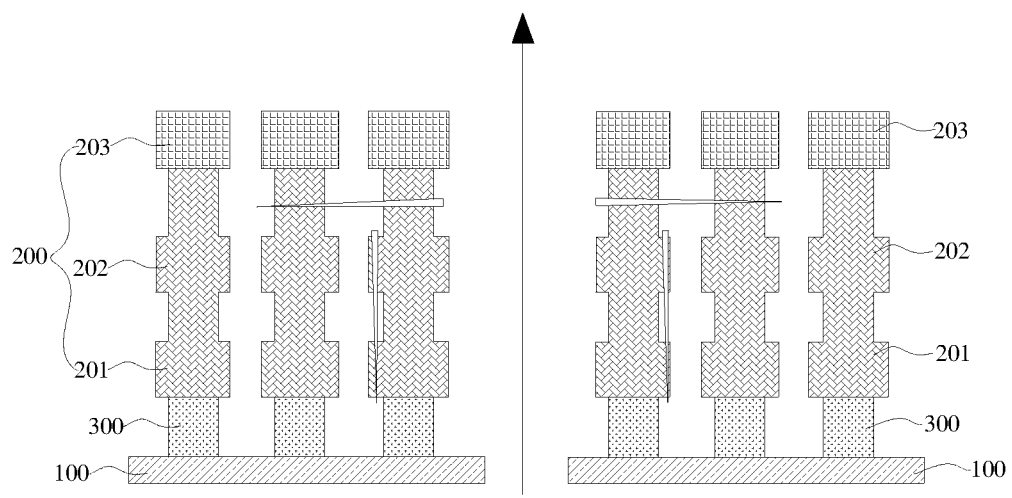
FIG. 1 is a schematic diagram of a semiconductor structure in the related art.

Exemplary embodiments are described more comprehensively with reference to the drawings at present. However, the exemplary embodiments may be implemented in various forms, and should not be understood that they are limited to those described herein. On the contrary, these provided embodiments enable the disclosure to be more comprehensive and complete. And conceptions of the exemplary embodiments are comprehensively conveyed to those skilled in the art. The same signs in the drawings indicate the same or similar structures, so that detailed description of them are omitted.

The features, structures or characteristics described above may be combined in one or more embodiments in any proper manner. The features discussed in each embodiment are interchangeable if possible. In the descriptions above, many specific details are provided to give a sufficient understanding of the embodiments of the disclosure. However, those skilled in the art will realize that: the technical solutions of the disclosure may be practiced without one or more of the specific details, or other methods, materials and the like may be adopted. In other cases, known structures, materials or operations will not be shown or described in detail to avoid obscuring each aspect of the disclosure.

Although the specification uses relative terms such as "on" and "below" to describe the relative relationship of shown one assembly to another, these terms are used in the specification only for convenience, such as, according to the illustrated direction in the drawings. It is understood that, if the device as shown is turned upside down, the assembly described as "on" will be the assembly described as "below". When a structure is "on" another structure, it may mean that the structure is integrally formed on another structure, or the structure is "directly" arranged on another structure or the structure is "indirectly" arranged on another structure by another structure between them.

Terms "one", "a/an", "the", "said" and "at least one" are used to indicate one or more elements/components/etc. Terms "include/comprise" and "have" are used to express a meaning including the open including, which indicates that additional elements/components/and the like may exist in addition to the listed elements/components/and the like. Terms such as "first" and "second" are merely used as signs, but not as a quantitative limitation to the objects.

Figure 2:
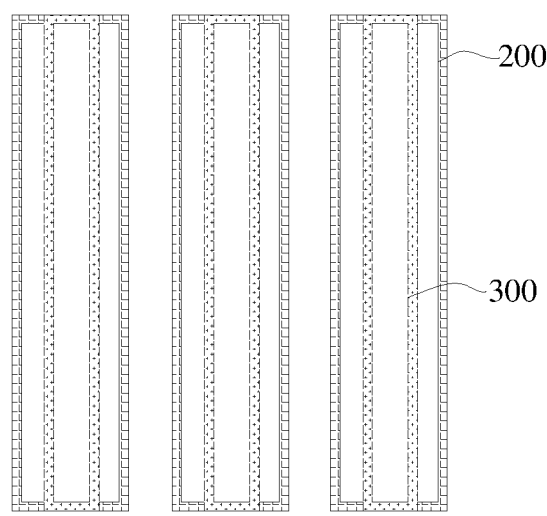
FIG. 2 is a top view of a semiconductor structure in the related art.

In the related art, as shown in FIG. 1 to FIG. 2, a semiconductor structure may mainly include a substrate 100 and a metal interconnection structure 200 formed on the substrate 100, in which the metal interconnection structure 200 may be connected with the substrate 100 through contact structures 300. The metal interconnection structure 200 may include a plurality of columns of metal wiring layers surrounding the periphery of a storage chip. Each column of metal wiring layer may include a first metal wiring layer 201, a second metal wiring layer 202 and a third metal wiring layer 203, which are connected through connecting pillars, so that the periphery of the storage chip is protected by the metal wiring layers, thereby preventing the internal storage chip from being scratched when each storage chip is diced. However, the metal wiring layers are each independent and do not interfere with each other. When dicing along the arrow direction shown in the figure, the metal wiring layer near the dicing line is easy to collapse under the action of an external stress, which affects the device yield.

Figure 3:
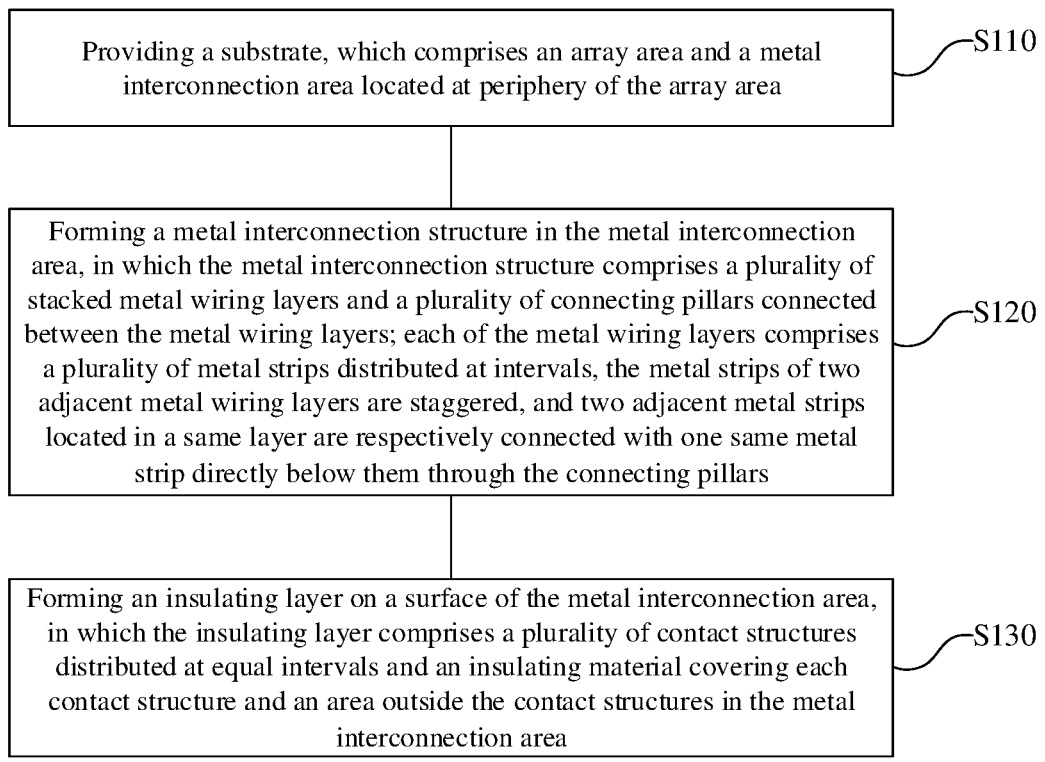
FIG. 3 is a flowchart of a method for forming a semiconductor structure in an embodiment of the disclosure.

The embodiment of the disclosure provides a method for forming a semiconductor structure, as shown in FIG. 3, the manufacturing method may include the following operations.

At S110, a substrate is provided, and the substrate includes an array area and a metal interconnection area located at periphery of the array area.

At S120, a metal interconnection structure is formed in the metal interconnection area, in which the metal interconnection structure includes a plurality of stacked metal wiring layers and a plurality of connecting pillars connected between the metal wiring layers; each metal wiring layer includes a plurality of metal strips distributed at intervals, the metal strips of two adjacent metal wiring layers are staggered, and two adjacent metal strips located in the same layer are respectively connected with one same metal strip directly below them through the connecting pillars.

According to the forming method of the semiconductor structure of the disclosure, the periphery of the array area can be protected with the metal interconnection structure to prevent external moisture from entering the array area from its sides, thus avoid damages of the moisture to the structure in the array area, and prolong the service life of the device. Meanwhile, because two adjacent metal strips in the same layer are respectively connected with one same metal strip directly below them through connecting pillars, the structural strength can be enhanced, and the structural stability can be improved. In a dicing process, external stresses can be resisted better; and a structural damage of the array area is avoided, further improving the product yield.

Each operation of the method for forming a semiconductor device in the embodiment of the disclosure is described in detail below.

As shown in FIG. 3, in S110, a substrate is provided, and the substrate includes an array area and a metal interconnection area located at the periphery of the array area.

Figure 4:
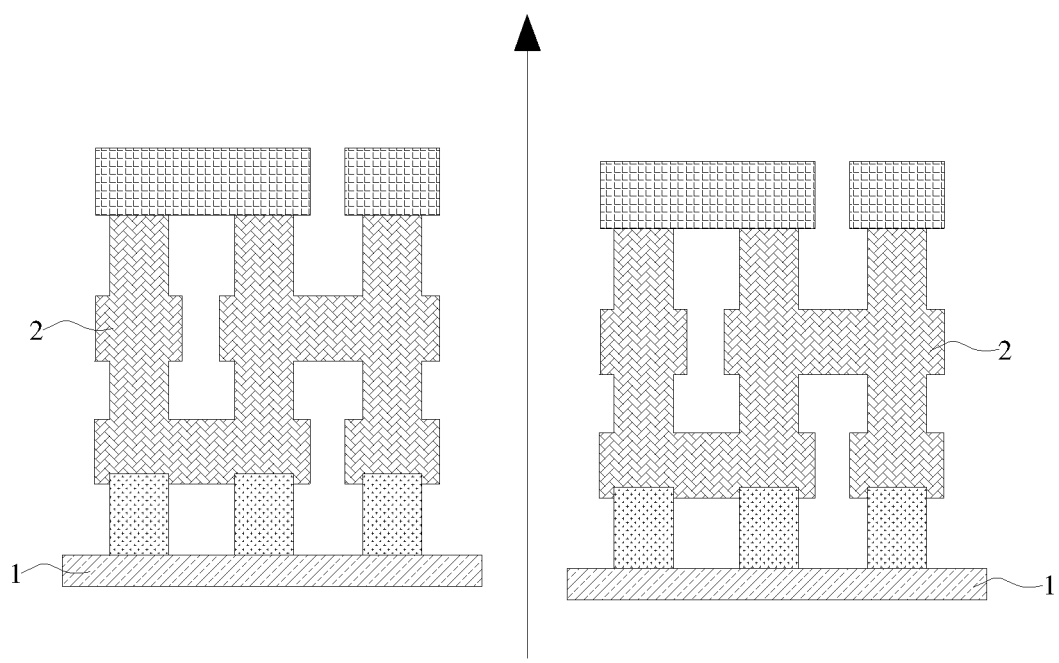
FIG. 4 is a schematic diagram of a semiconductor structure in an embodiment of the disclosure.

As shown in FIG. 4, the substrate 1 may be a flat plate structure, which may be a rectangular, circular, elliptical, polygonal or irregular shape, and its material may be silicon or other semiconductor materials. Here, the shape and material of the substrate 1 are not specially limited.

Figure 5:
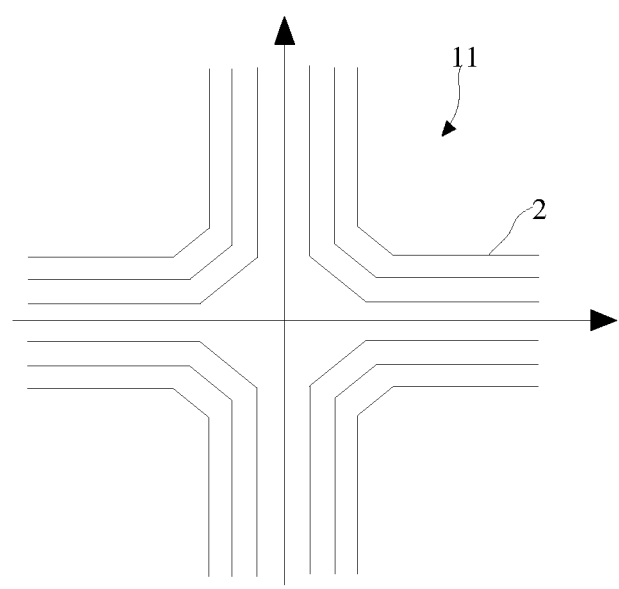
FIG. 5 is a top view of the distribution of each storage chip in an embodiment of the disclosure.

As shown in FIG. 5, the substrate 1 may include an array area 11 and a metal interconnection area, in which the array area 11 and the metal interconnection area may be adjacent to each other, and the metal interconnection area may surround the periphery of the array area 11. The array area 11 may be configured to form a storage chip, and the metal interconnection area may be configured to form a metal interconnection structure 2, which may be configured to protect the periphery of the storage chip by preventing external moisture from entering the array area 11 from the sides, so as to avoid damages of the moisture to the structure of the storage chip, and prolong the service life of the storage chip. The substrate 1 may have a plurality of array areas 11, the periphery of each array area 11 may be provided with a metal interconnection structure 2, and the storage chips in each array area 11 may be diced along the arrow directions in FIG. 5 to obtain separated storage chips.

For example, the array area 11 may be a circular area, a rectangular area or an irregular graphic area. Certainly, it may also be an area of other shapes, which is not specially limited here. The metal interconnection area may be an annular area surrounding the periphery of the array area 11. It may be a circular annular area a rectangular annular area or an annular area with other shapes, which will not be listed one by one here.

As shown in FIG. 3, in S120, a metal interconnection structure is formed in the metal interconnection area, in which the metal interconnection structure may include a plurality of stacked metal wiring layers and a plurality of connecting pillars connected between the various metal wiring layers. Each metal wiring layer may include a plurality of metal strips distributed at intervals, and the metal strips of two adjacent metal wiring layers are staggered, and two adjacent metal strips located in the same layer are respectively connected with one same metal strip directly below them through connecting pillars.

The metal wiring layer may include a plurality of metal strips, in which and the metal strips may be set in the same layer and distributed at equal intervals. It is to be noted that, the thickness of the metal strips in the same layer may be equal, and their widths may be different.

The material of the metal wiring layer may be a conductive material, and the components in the substrate 1 can be electrically connected to the outside through the metal wiring layers. For example, the material may be a metal material, such as copper or aluminum. Certainly, it may also be other metal materials, which is not specially limited here.

Figure 6:
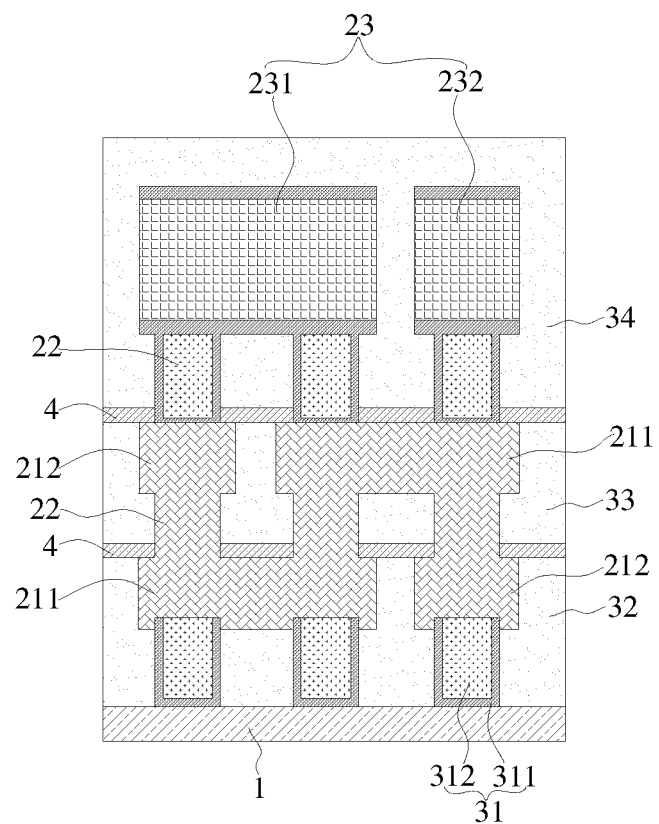
FIG. 6 is a schematic diagram of a plurality of metal wiring layers in an embodiment of the disclosure.

In an embodiment of the disclosure, as shown in FIG. 6, a plurality of stacked metal wiring layers may be formed in the metal interconnection area of the substrate 1, and two adjacent metal wiring layers may be connected together through the connecting pillars 22 to form the metal interconnection structure 2. There may be a plurality of connecting pillars 22, in which the plurality of connecting pillars 22 may be arranged in parallel, and each connecting pillar 22 may be distributed in a direction perpendicular to the metal wiring layers. For example, the number of the metal wiring layers may be 2, 3, 4, 5 or 6. Certainly, it may also be other numbers. The number of the metal wiring layers may be reasonably set according to the actual needs, and there is no special limit here.

In an embodiment, each connecting pillar 22 may be made of the same material as each metal wiring layer and may be integrally formed with a metal wiring layer. The metal strips in two adjacent metal wiring layers may be staggered, and two adjacent metal strips located in the same layer may be connected with the single metal strip directly below them through connecting pillars 22.

In an embodiment of the disclosure, the metal wiring layer may include a first metal strip 211 and a second metal strip 212 distributed side by side, in which the width of a first metal strip 211 may be greater than the width of a second metal strip 212. For example, the width of the first metal strip 211 may be at least greater than the sum of the width of a second metal strip 212 and the distance between the first metal strip 211 the second metal strip 212. For example, the width of a first metal strip 211 may be 3 nm, and the width of a second metal strip 212 may be 2 nm, and the distance between the first metal strip 211 and the second metal strip 212 may be 0.5 nm.

Each metal wiring layer may include a first metal strip 211 and a second metal strip 212 distributed side by side, in which the widths of the first metal strips 211 in different layers may be equal, and the widths of the second metal strips 212 in different layers may also be equal. Meanwhile, the distances between the first metal strip 211 and the second metal strip 212 in different layers may be equal.

In two adjacent metal wiring layers, the first metal strip 211 and the second metal strip 212 located in the lower metal wiring layer may be arranged in sequence along a preset direction, and the first metal strip 211 and the second metal strip 212 located in the upper metal wiring layer may be arranged in sequence along the opposite direction of the preset direction, and the upper and lower metal wiring layers may be aligned at both ends.

Since the width of the first metal strip 211 is greater than the sum of the width of the second metal strip 212 and the distance between the first metal strip 211 and the second metal strip 212, meanwhile the upper and lower metal wiring layers may be aligned at both ends. In the upper and lower metal wiring layers, the first metal strip 211 located in the lower metal wiring layer may be set directly opposite to the second metal strip 212 located in the upper metal wiring layer, and may extend to a position below the first metal strip 211 located in the upper metal wiring layer; and an end of the upper first metal strip 211 away from the lower first metal strip 211 may be directly opposite to the second metal strip 212 located in the lower metal wiring layer. At this time, the metal strips directly opposite to each other in two adjacent metal wiring layers may be connected through the same connecting pillar 22. That is, the first metal strip 211 located in the upper metal wiring layer may be connected with the first metal strip 211 and the second metal strip 212 located in the lower metal wiring layer respectively through two connecting pillars 22, and the second metal strip 212 located in the upper metal wiring layer may be connected with the first metal strip 211 located in the lower metal wiring layer through one connecting pillar 22. Thus, the structural strength in the transverse direction is enhanced, and the structural stability is improved. In a dicing process, external stresses may be better resisted, to avoid the structural damage of the array area 11 and thus improve the product yield.

In an embodiment, as shown in FIG. 3, the forming method of the disclosure may also include the following operations.

At S130, an insulating layer is formed on the surface of the metal interconnection area, in which the insulating layer may include a plurality of contact structures distributed at equal intervals and an insulating material covering each contact structure and an area outside the contact structures in the metal interconnection area.

The insulating layer may be formed on the surface of the metal interconnection area of the substrate 1 by a vacuum evaporation process, a magnetron sputtering process, a chemical vapor deposition process, a physical vapor deposition process or an atomic layer deposition process. The insulating layer may be a thin film formed on the surface of the metal interconnection area, which may include a plurality of contact structures 31 distributed at equal intervals and an insulating material covering each contact structure 31 and the metal interconnection area other than each contact structure 31. In an embodiment, the insulating material may be silicon oxide or silicon nitride.

It is to be noted that, the contact structures 31 may be composed of a conductive material, and each contact structure 31 may be separated by an insulating material to avoid coupling between the contact structures 31. Meanwhile, an air gap may also be arranged in the contact structure 31, so that the parasitic capacitance can be reduced due to the relatively low dielectric constant of the air. There may be a plurality of contact structures 31, for example, 3, 4, 5 or 6. Certainly, there may also be other numbers, which are not specially limited here.

The metal interconnection structure 2 may be formed in the insulating layer, and may be laterally supported by the insulating layer, which may enhance the structural stability and prevent collapse of the structural. The metal interconnection structure 2 may be located on one side of the contact structures 31 away from the substrate 1, and the lowest metal wiring layer in the metal interconnection structure 2 may be connected with each contact structure 31 by contact. The metal interconnection structure 2 may be connected with the substrate 1 through the contact structures 31, so as to realize the electrical connection between each component in the substrate 1 and the outside.

For example, an insulating material may be deposited on the metal interconnection area of the substrate 1 by a chemical vapor deposition process to form an insulating material layer. Afterwards, the insulating material layer may be etched by a photo etching process to form a plurality of openings exposing the substrate 1 in the insulating layer, and contact structures 31 may be formed in each opening by a chemical vapor deposition process. In an embodiment of the disclosure, a contact structure 31 may include a barrier layer 311 and a metal layer 312. The barrier layer 311 may be attached to the side wall and bottom surface of an opening in accordance with the shape of the opening. The metal layer 312 is located on the barrier layer 311 and may fill up the opening. The barrier layer 311 can prevent metal diffusion in the metal layer 312. The materials of the barrier layer 311 and the metal layer 312 may be conductive materials. For example, the material of the barrier layer 311 may be titanium nitride, and the material of the metal layer 312 may be tungsten. After the contact structures 31 are formed, an insulating material may be continuously deposited on the upper surface of the insulating material layer to form an insulating layer.

Figure 7:
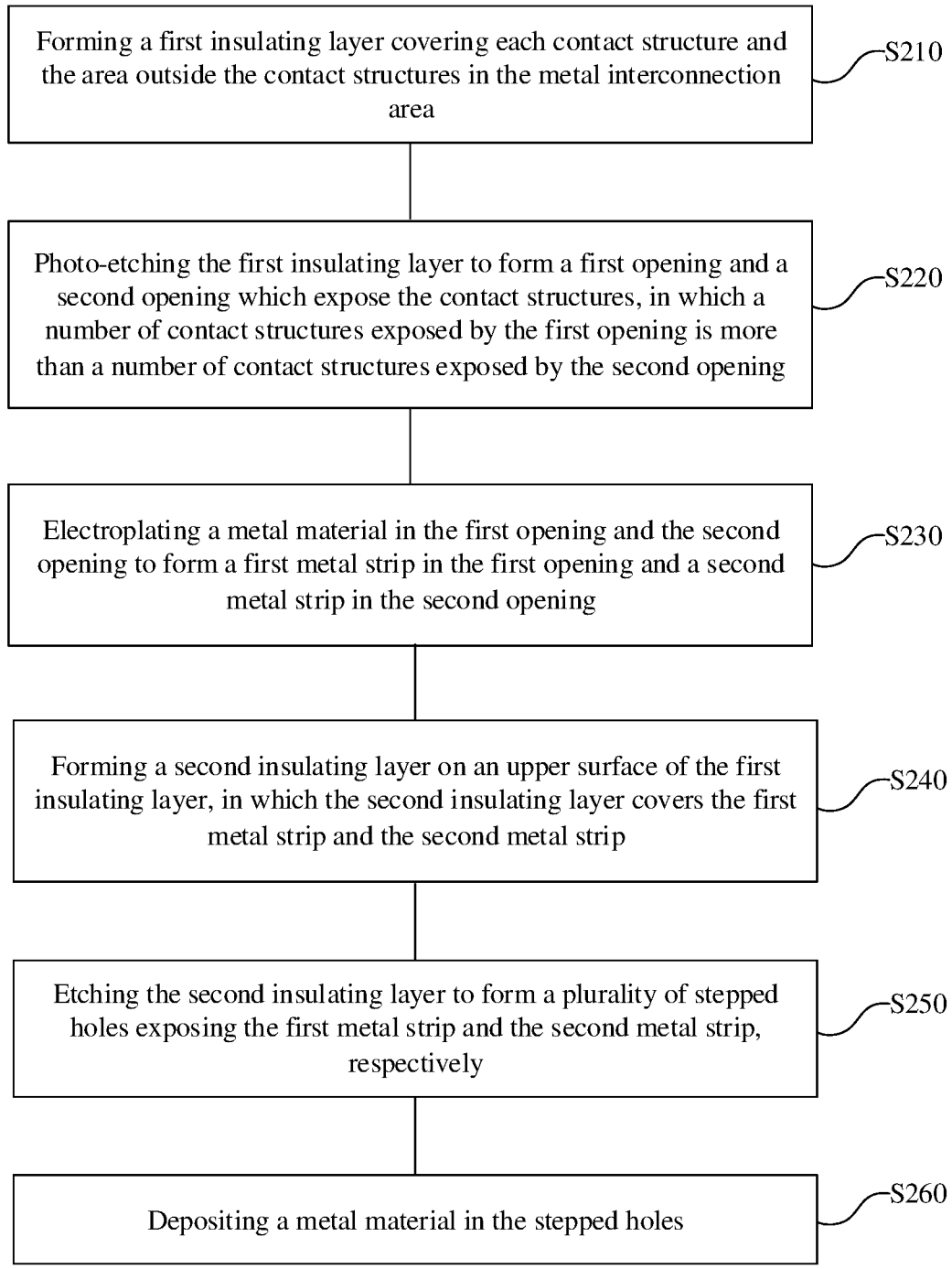
FIG. 7 is a flowchart of S120 in an embodiment shown in FIG. 3.

In an embodiment of the disclosure, the insulating layer may include a first insulating layer 32, a second insulating layer 33 and a third insulating layer 34 which are stacked. As shown in FIG. 7, forming the metal interconnection structure 2 in the metal interconnection area may include S210 to S260.

At S210, a first insulating layer covering each contact structure and an area outside the contact structures in the metal interconnection area is formed.

Figure 8:
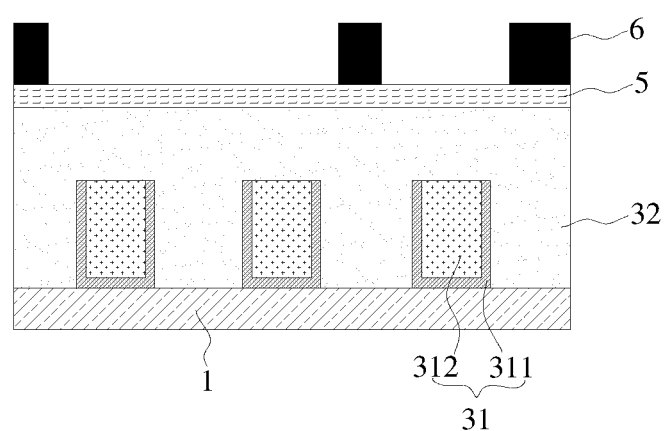
FIG. 8 is a schematic diagram of a first insulating layer in an embodiment of the disclosure.

As shown in FIG. 8, after the contact structures 31 are formed, an insulating material may be continuously deposited on the upper surfaces of the contact structures 31 and the substrate 1 to form a first insulating layer 32. For example, the first insulating layer 32 may be formed on the upper surfaces of the contact structures 31 and the substrate 1 by a vacuum evaporation process, a magnetron sputtering process or a chemical vapor deposition process. Certainly, the first insulating layer 32 may also be formed by other methods, which will not be listed one by one here. The material of the first insulating layer 32 may be silicon dioxide, and the material is not specially limited here.

At S220, the first insulating layer is photo etched to form a first opening and a second opening exposing the contact structure, and the number of the contact structures exposed by the first opening is more than the number of the contact structure(s) exposed by the second opening.

Figure 9:
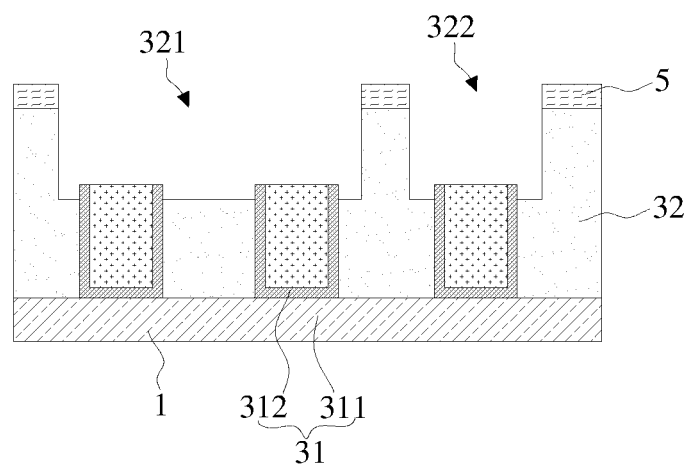
FIG. 9 is a schematic diagram of a first opening and a second opening in an embodiment of the disclosure.

As shown in FIG. 8 and FIG. 9, the first insulating layer 32 may be etched by a photo etching process to form a first opening 321 and a second opening 322, which expose the contact structures 31, in which the width of the first opening 321 may be greater than the width of the second opening 322. For example, a hard mask layer 5 may be formed on the upper surface of the first insulating layer 32. The material of the hard mask layer 5 may be silicon oxide or silicon nitride. The hard mask layer 5 may be photo etched to form a mask pattern, so that the mask pattern may be transferred to the first insulating layer 32.

Specifically, a photoresist layer 6 may be formed on the hard mask layer 5 by spin coating or other means. The material of the photoresist layer 6 may be a positive photoresist or a negative photoresist, which is not specially limited herein. The photoresist layer 6 may be exposed by using a mask whose pattern may be matched with the pattern required by the first opening 321 and the second opening 322. Afterwards, the exposed photoresist layer 6 may be developed to form developing areas. The developing areas may expose the hard mask layer 5, and the pattern of the developing areas may be the same as that required by the first opening 321 and the second opening 322, and the sizes of the developing areas are the same as that of the required first opening 321 and second opening 322.

The hard mask layer 5 may be etched by a dry etching process in the developing areas, so as to transfer the pattern from the photoresist to the hard mask layer 5. Afterwards, after the photoresist is removed, the first insulating layer 32 is etched by dry etching by using the hard mask layer 5 as a shielding layer to form a first opening 321 and a second opening 322. The etching depths of the first opening 321 and the second opening 322 are the same, and both the first opening 321 and the second opening 322 expose the contact structures 31, in which, the number of contact structures 31 exposed by the first opening 321 may be greater than the number of contact structure(s) 31 exposed by the second opening 322. For example, in the case that there are three contact structures 31 distributed at equal intervals side by side on the substrate 1, the first opening 321 may expose two adjacent contact structures 31, and the second opening 322 may expose another contact structure 31.

At S230, a metal material is electroplated in the first opening and the second opening to form a first metal strip in the first opening and a second metal strip in the second opening.

Figure 10:
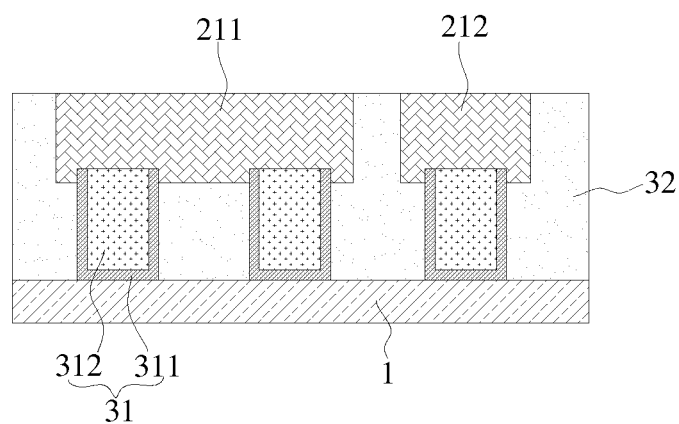
FIG. 10 is a schematic diagram of a first metal strip and a second metal strip of a first metal wiring layer in an embodiment of the disclosure.

As shown in FIG. 10, a metal material is electroplated in the first opening 321 and the second opening 322 by an electroplating process by taking the contact structures 31 as the electroplating cathodes. The metal material may fill up the first opening 321 and the second opening 322, so that the first metal strip 211 may be formed in the first opening 321, which is electrically connected with the two contact structures 31 below it; meanwhile, the second metal strip 212 may be formed in the second opening 322, which is electrically connected with the contact structure 31 below it. The first metal strip 211 and the second metal strip 212 may constitute a first metal wiring layer. The metal material may be copper or aluminum, which is not specially limited here.

It is to be noted that, after the first metal strip 211 and the second metal strip 212 are formed, the surfaces, away from the substrate 1, of the first metal strip 211 and the second metal strip 212 may be planarized. Therefore, the surfaces of the first metal strip 211 and the second metal strip 212 are flush with the surface of the first insulating layer 32. For example, the surfaces, away from the substrate 1, of the first metal strip 211 and the second metal strip 212 may be planarized by a chemical mechanical polishing process, or the surfaces, away from the substrate 1, of the first metal strip 211 and the second metal strip 212 may be planarized by a chemical polishing process. Certainly, the planarization may also be performed by other processes, which will not be listed one by one here.

At S240, the second insulating layer is formed on the upper surface of the first insulating layer, and the second insulating layer covers the first metal strip and the second metal strip.

After the first metal strip 211 and the second metal strip 212 are planarized, the second insulating layer 33 may be formed on the upper surface of the first insulating layer 32 by a vacuum evaporation process, a magnetron sputtering process or a chemical vapor deposition process, and the second insulating layer 33 may cover the first metal strip 211 and the second metal strip 212.

It is to be noted that, before the second insulating layer 33 is formed, a stop layer 4 may be formed on the upper surface of the first insulating layer 32. The stop layer 4 can prevent the first metal strip 211 and the second metal strip 212 from further etching.

At S250, the second insulating layer is etched to form a plurality of stepped holes exposing the first metal strip and the second metal strip respectively.

Figure 11:
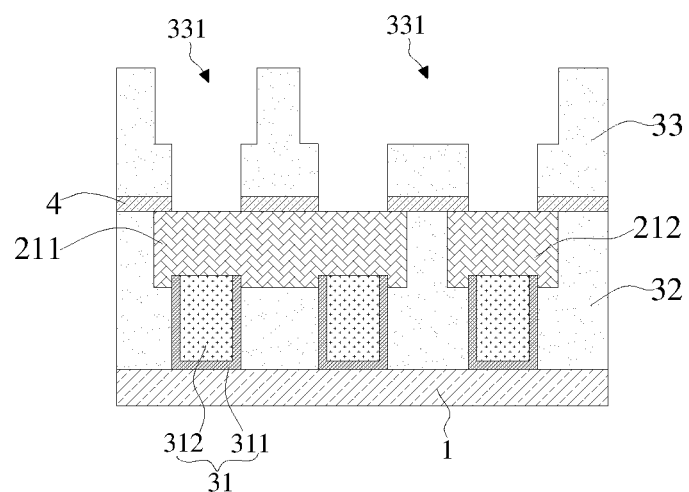
FIG. 11 is a schematic diagram of a stepped hole in an embodiment of the disclosure.

As shown in FIG. 11, the second insulating layer 33 may be etched by a photo etching process to form a plurality of stepped holes 331 exposing the first metal strip 211 and the second metal strip 212 respectively. Each stepped hole 331 may be a through hole and may include a plurality of mutually butted hole sections, in which the hole diameter of the hole section close to the first metal wiring layer may be less than that of the hole section away from the first metal wiring layer, and the hole diameter of the hole section close to the first metal wiring layer may be equal to the width of the contact hole.

The number of the stepped holes 331 may be the same as the number of the contact structures 31, and each stepped hole 331 may be arranged directly opposite to each contact structure 31. In an embodiment, among the stepped holes 331 corresponding to the first metal strip 211, the stepped hole 331 closest to the second metal strip 212 is communicated with all the stepped holes 331 corresponding to the second metal strip 212 via their upper openings. For example, when there are three contact holes, the number of the stepped holes 331 may also be three, and the number of the stepped holes 331 corresponding to the first metal strip 211 may be two.

Figure 12:
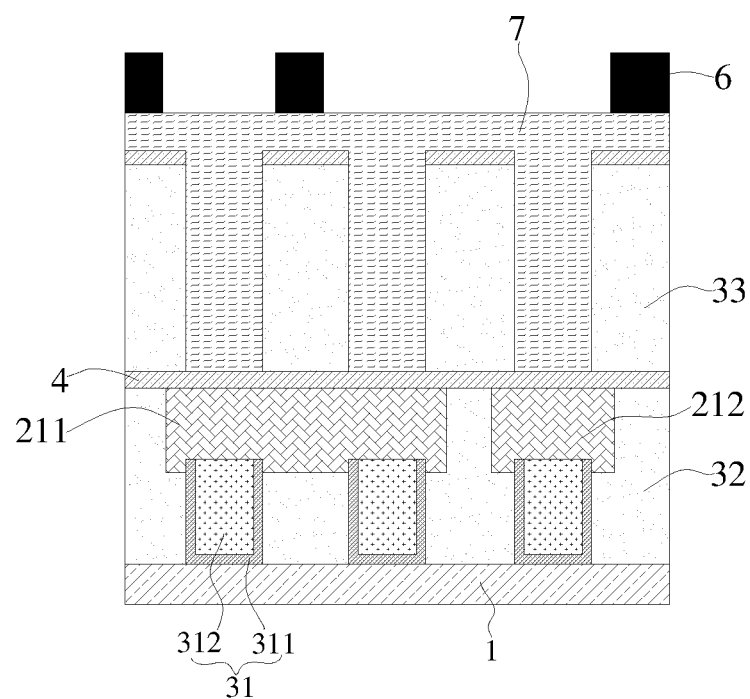
FIG. 12 is a schematic diagram of a second insulating layer in an embodiment of the disclosure.

For example, as shown in FIG. 12, the second insulating layer 33 may be anisotropically etched to form a plurality of through holes, in which each through hole may be arranged in one-to-one correspondence with each contact structure 31, and the hole diameter of each through hole may be equal to the width of the contact structures 31. A mask material 7 may be deposited on the upper surface of the second insulating layer 33 by a chemical vapor deposition process, and the mask material 7 may fill up each through hole.

Photoresist may be formed on the upper surface of the mask material 7, and then the photoresist layer 6 is exposed with a mask, in which the pattern of the mask may be matched with the pattern required by the stepped holes 331. Afterwards, the exposed photoresist layer 6 may be developed to form developing areas, which expose the mask material 7. The pattern of the developing areas may be the same as that required by the stepped holes 331, and the sizes of the developing areas are the same as that of the required stepped holes. The mask material 7 may be etched by a dry etching process, so as to transfer the pattern from the photoresist to the mask material 7. Afterwards, after the photoresist is removed, by taking the mask material 7 as a shielding layer, the mask material 7 and the second insulating layer 33 are etched by a dry etching process to form the stepped holes 331. Then, the mask material 7 may be removed to expose the hole wall and bottom of each stepped hole 331. The structure after completing S250 is shown in FIG. 11.

At S260, the metal material is deposited in the stepped holes.

Figure 13:
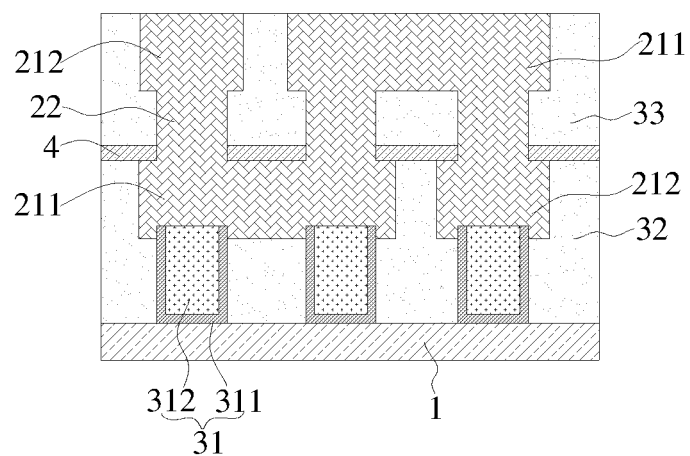
FIG. 13 is a schematic diagram of a first metal strip and a second metal strip of a second metal wiring layer in an embodiment of the disclosure.

As shown in FIG. 13, by taking the first metal strip 211 and the second metal strip 212 as electroplating cathodes, a metal material is electroplated in each stepped hole 331 by an electroplating process. The metal material may fill up each stepped hole 331, so that connecting pillars 22 may be formed in the hole sections close to the first metal wiring layer in each stepped hole 331. A first metal strip 211 is formed in the hole sections away from the first metal wiring layer in the communicated stepped holes 331, and a second metal strip 212 is formed in the hole section away from the first metal wiring layer in the other stepped hole 331. The first metal strip 211 and the second metal strip 212 may form a second metal wiring layer.

It is to be noted that, after the first metal strip 211 and the second metal strip 212 constituting the second metal wiring layer are formed, the metal material in the stepped holes 331 may be planarized. Therefore, the surface of the metal material in the stepped holes 331 is flush with the surface of the second insulating layer 33. For example, the upper surface of the metal material may be planarized by adopting a chemical mechanical polishing process and may also be planarized by adopting a chemical polishing process. Certainly, the planarizing treatment may also be performed by other processes, which will not be listed one by one here.

Figure 14:
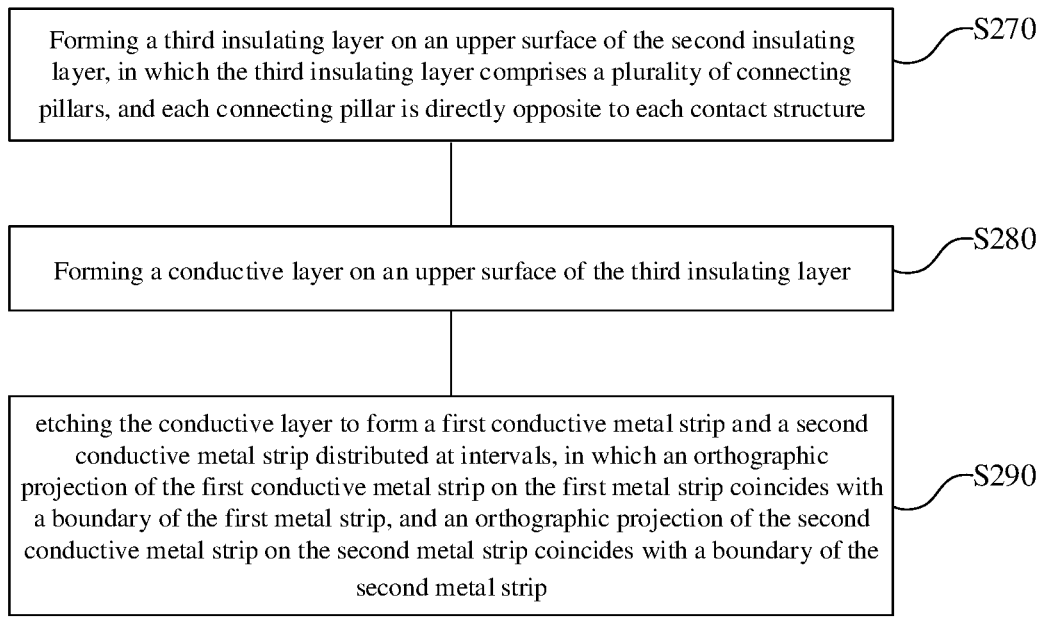
FIG. 14 is a flowchart of S120 in another embodiment in FIG. 3.

In an embodiment of the disclosure, forming the metal interconnection structure 2 in the metal interconnection area further includes S270 to S290, as shown in FIG. 14.

At S270, a third insulating layer is formed on the upper surface of the second insulating layer, and the third insulating layer may include a plurality of connecting pillars, in which each connecting pillar is arranged directly opposite to each contact structure.

Figure 15:
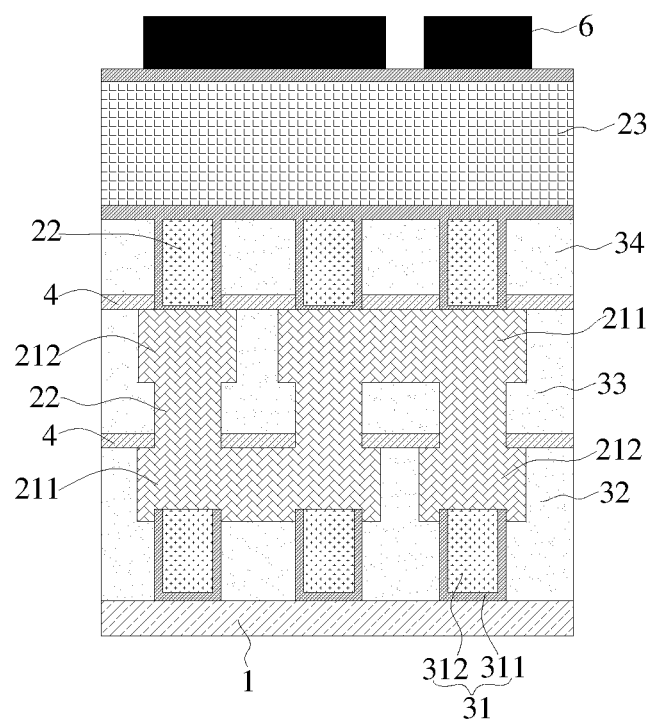
FIG. 15 is a schematic diagram of a conductive layer in an embodiment of the disclosure.

As shown in FIG. 15, a third insulating layer 34 may be formed on the surface of the second insulating layer 33 by a vacuum evaporation process, a magnetron sputtering process, a chemical vapor deposition process, a physical vapor deposition process or an atomic layer deposition process. The third insulating layer 34 may include a plurality of connecting pillars 22 distributed at equal intervals and an insulating material covering the second metal wiring layer.

There may be a plurality of connecting pillars 22, the number of which may be equal to the number of contact structures 31, and each connecting pillar 22 may be arranged in one-to-one correspondence with each contact structure 31. In addition, the connecting pillars 22 may be made of a conductive material and may be electrically connected with the first metal strip 211 and the second metal strip 212 of the second metal wiring layer. The structure of a connecting pillar 22 may be the same as that of a contact structure 31, or a connecting pillar 22 may be an integrated structure with the first metal strip 211 or the second metal strip 212 of the second metal wiring layer. The structure of the connecting pillars 22 is not specially limited here.

It is to be noted that, before the third insulating layer 34 is formed, a stop layer 4 may also be formed on the upper surface of the second insulating layer 33. The stop layer 4 can prevent the diffusion of a metal material to other layers, and the etching depth can be controlled by the stop layer 4. The connecting pillars 22 are connected with the second metal wiring layer by penetrating the stop layer 4.

At S280, a conductive layer is formed on the upper surface of the third insulating layer.

As shown in FIG. 15, the conductive layer 23 may be consisted of a conductive material, which may be a single-layer structure or a multi-layer film layer structure, which is not specially limited here. When the conductive layer 23 is a single-layer structure, the material of the conductive layer 23 may be copper. When the conductive layer 23 is a multi-layer film layer structure, the conductive layer 23 may be a three-layer stacked structure, in which the thickness of the intermediate layer of the stacked structure may be greater than those of the upper and lower film layers. In an embodiment, the material of the intermediate layer may be aluminum, and the material of the upper and lower film layers may be titanium or titanium nitride. The upper and lower film layers may not only play the role of forming a conductive structure, but also effectively prevent the diffusion of the metal material of the intermediate layer.

The conductive layer 23 may be formed on the upper surface of the third insulating layer 34 by a vacuum evaporation process, a magnetron sputtering process, a chemical vapor deposition process, a physical vapor deposition process or an atomic layer deposition process. Certainly, the conductive layer 23 may also be formed by other methods, which will not be listed one by one here.

At S290, the conductive layer is etched to form a first conductive metal strip and a second conductive metal strip distributed at intervals, in which the boundary of the orthographic projection of the first conductive metal strip on the first metal wiring layer is coincide with the boundary of the first metal strip in this layer, and the boundary of the orthographic projection of the second conductive metal strip on the first metal wiring layer is coincide with the boundary of the second metal strip in this layer.

Figure 16:
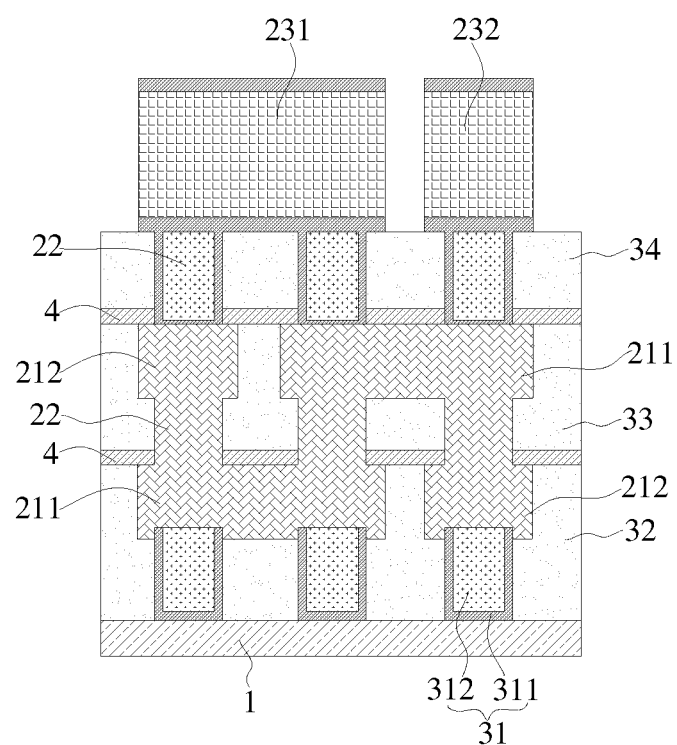
FIG. 16 is a schematic diagram of a first conductive metal strip and a second conductive metal strip of a third metal wiring layer in an embodiment of the disclosure.

As shown in FIG. 15 and FIG. 16, the conductive layer 23 may be etched by a photo etching process to form a third metal wiring layer. Specifically, photoresist may be formed on the surface of the conductive layer 23 by a spin coating process, then the photoresist is exposed and developed to form developing areas, and the conductive layer 23 is etched in the developing areas to form a first conductive metal strip 231 and a second conductive metal strip 232 distributed at intervals. The boundary of the orthographic projection of the first conductive metal strip 231 on the first metal wiring layer is coincide with the boundary of the first metal strip 211 of the first metal wiring layer, and the boundary of the orthographic projection of the second conductive metal strip 232 on the first metal wiring layer is coincide with the boundary of the second metal strip 212 of the first metal wiring layer. The first conductive metal strip 231 and the second conductive metal strip 232 may constitute the third metal wiring layer.

Figure 17:
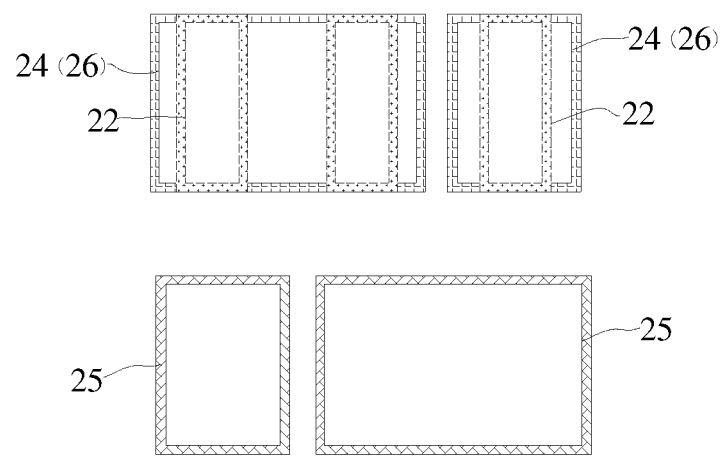
FIG. 17 is a top view of a first metal wiring layer, a second metal wiring layer and a third metal wiring layer in an embodiment of the disclosure.

Top views of the finally formed first metal wiring layer 24, second metal wiring layer 25 and third metal wiring layer 26 are shown in FIG. 17.

It is to be noted that, other metal wiring layers may also be formed above the third metal wiring layer 26, and the number of metal wiring layers is not specially limited here.

After each metal wiring layer is formed, each metal wiring layer may be filled with an insulating material, such that the metal interconnection structure 2 may be separated from other film layers by the insulating material to avoid coupling. Meanwhile, the metal interconnection structure 2 may be laterally supported by the insulating material to enhance the structural stability.

The embodiment of the disclosure further provides a semiconductor structure, which may include a substrate 1 and a metal interconnection structure 2.

The substrate 1 may include an array area 11 and a metal interconnection area located at the periphery of the array area 11.

The metal interconnection structure 2 may be formed in the metal interconnection area. The metal interconnection structure 2 may include a plurality of stacked metal wiring layers and a plurality of connecting pillars 22 connected between the metal wiring layers. Each metal wiring layer may include a plurality of metal strips distributed at intervals, the metal strips of two adjacent metal wiring layers are staggered, and two adjacent metal strips located in the same layer are respectively connected with one same metal strip directly below them through the connecting pillars 22.

The specific details and forming process of each part of the above semiconductor structure have been described in detail in the corresponding method for forming a semiconductor structure. Therefore, it will not be elaborated here.

Furthermore, the disclosure also provides a storage device, which may include a semiconductor structure of any of the above embodiments and a storage chip formed in the array area 11. A metal interconnection structure 2 may coat around the periphery of the storage chip, such that the periphery of the storage chip can be protected by the metal interconnection structure 2 to prevent external moisture from entering the storage chip from the sides, thus avoid damages of the moisture to a structure in the storage chip, and prolong the service life of the device. Meanwhile, because two adjacent metal strips in the same layer are respectively connected with one same metal strip directly below them through the connecting pillars 22, the structural strength can be enhanced, and the structural stability can be improved. In the dicing process, external stresses can be better resisted, the structural damage of the storage area is avoided, and the product yield is improved.

The storage device may be a DRAM. Certainly, it may also be other types of storage devices, which will not be listed one by one here.

After considering the specification and practicing the disclosure here, those skilled in the art will easily think of other implementation schemes of the disclosure. The disclosure aims to contain any modifications, applications or adaptive changes of the disclosure, which follow the general principle of the disclosure and include common knowledge or conventional technical means in the related technical field that is not disclosed in the disclosure. The specification and the embodiments are exemplary, and the practical scope and spirit of the disclosure are represented by the appended claims.

The invention claimed is:

1. A method for forming a semiconductor structure, comprising:
providing a substrate, wherein the substrate comprises an array area and a metal interconnection area located at periphery of the array area; and
forming a metal interconnection structure in the metal interconnection area, wherein the metal interconnection structure comprises a plurality of stacked metal wiring layers and a plurality of connecting pillars connected between the metal wiring layers; each of the metal wiring layers comprises a plurality of metal strips distributed at intervals, and the metal strips of two adjacent metal wiring layers are staggered, and two adjacent metal strips located in a same layer are respectively connected with one same metal strip directly below them through the connecting pillars; and,
wherein each metal wiring layer comprises a first metal strip and a second metal strip distributed at intervals and a width of the first metal strip is greater than a width of the second metal strip.

2. The method according to claim 1, further comprising:
forming an insulating layer on a surface of the metal interconnection area, wherein the insulating layer comprises a plurality of contact structures distributed at equal intervals and an insulating material covering each contact structure and an area outside the contact structures in the metal interconnection area.

3. The method for forming according to claim 2, wherein the metal interconnection structure is formed in the insulating layer, and is electrically connected with the substrate through each of the contact structures.

4. The method according to claim 2, wherein
forming a metal interconnection structure in the metal interconnection area comprises:
forming a first insulating layer covering each contact structure and the area outside the contact structures in the metal interconnection area;
photo etching the first insulating layer to form a first opening and a second opening which expose the contact structures, in which a number of contact structures exposed by the first opening is more than a number of contact structures exposed by the second opening;
electroplating a metal material in the first opening and the second opening to form a first metal strip in the first opening and a second metal strip in the second opening;
forming a second insulating layer on an upper surface of the first insulating layer, in which the second insulating layer covers the first metal strip and the second metal strip;
etching the second insulating layer to form a plurality of stepped holes exposing the first metal strip and the second metal strip, respectively; and
depositing a metal material in the stepped holes.

5. The method according to claim 4, wherein depositing the metal material in the stepped hole comprises:
electroplating the metal material in each stepped hole by an electroplating process with the first metal strip and the second metal strip as electroplating cathodes.

6. The method according to claim 4, wherein forming the metal interconnection structure in the metal interconnection area further comprises:
forming a third insulating layer on an upper surface of the second insulating layer, in which the third insulating layer comprises a plurality of connecting pillars, and each connecting pillar is directly opposite to each contact structure;
forming a conductive layer on an upper surface of the third insulating layer; and
etching the conductive layer to form a first conductive metal strip and a second conductive metal strip distributed at intervals, wherein a boundary of an orthographic projection of the first conductive metal strip on the first insulating layer coincides with a boundary of the first metal strip, and a boundary of an orthographic projection of the second conductive metal strip on the first insulating coincides with a boundary of the second metal strip.

7. The method according to claim 6, further comprising:
planarizing the metal material in the stepped holes before the third insulating layer is formed to make a surface of the metal material in the stepped holes is flush with a surface of the second insulating layer.

8. The method according to claim 4, further comprising:
planarizing upper surfaces of the first metal strip and the second metal strip before the second insulating layer is formed.

9. The method according to claim 1, wherein in two adjacent metal wiring layers, the first metal strip and the second metal strip located in a lower metal wiring layer are arranged in sequence along a preset direction, and the first metal strip and the second metal strip located in an upper metal wiring layer are arranged in sequence along an opposite direction of the preset direction.

10. The semiconductor structure according to claim 1, wherein in two adjacent metal wiring layers, the first metal strip and the second metal strip located in a lower metal wiring layer are arranged in sequence along a preset direction, and the first metal strip and the second metal strip located in an upper metal wiring layer are arranged in sequence along a opposite direction of the preset direction.

11. A semiconductor structure, comprising:
a substrate, comprising an array area and a metal interconnection area located at periphery of the array area; and
a metal interconnection structure, formed in the metal interconnection area, wherein the metal interconnection structure comprises a plurality of stacked metal wiring layers and a plurality of connecting pillars connected between the metal wiring layers; each metal wiring layer comprises a plurality of metal strips distributed at intervals, and the metal strips of two adjacent metal wiring layers are staggered distributed, and two adjacent metal strips located in a same layer are respectively connected with one same metal strip directly below them through the connecting pillars; and,
wherein each metal wiring layer comprises a first metal strip and a second metal strip distributed at intervals and a width of the first metal strip is greater than a width of the second metal strip.

12. The semiconductor structure according to claim 11, further comprising:
an insulating layer, formed on a surface of the metal interconnection area, wherein the insulating layer comprises a plurality of contact structures distributed at equal intervals and an insulating material covering each contact structure and an area outside the contact structures in the metal interconnection area.

13. The semiconductor structure according to claim 12, wherein the metal interconnection structure is formed in the insulating layer, and is electrically connected with the substrate through each contact structure.

14. The semiconductor structure according to claim 12, wherein each contact structure is directly opposite to each connecting pillar.

15. A storage device, comprising the semiconductor structure according to claim 11, and
a storage chip, formed in the array area, wherein the metal interconnection structure is coated around periphery of the storage chip.

* * * * *